United States Patent
Ichinose et al.

(10) Patent No.: US 6,784,275 B2
(45) Date of Patent: Aug. 31, 2004

(54) ACTIVE ENERGY RAY-CURABLE POLYIMIDE RESIN COMPOSITION

(75) Inventors: Eiju Ichinose, Chiba (JP); Yohzoh Yamashina, Chiba (JP); Hidenobu Ishikawa, Chiba (JP)

(73) Assignee: Dainippon Ink and Chemicals, Inc., Tokyo (JP)

( * ) Notice: Subject to any disclaimer, the term of this patent is extended or adjusted under 35 U.S.C. 154(b) by 0 days.

(21) Appl. No.: 10/180,313

(22) Filed: Jun. 27, 2002

(65) Prior Publication Data

US 2003/0130475 A1 Jul. 10, 2003

(30) Foreign Application Priority Data

Jun. 28, 2001 (JP) ............................. P.2001-196548
Jul. 31, 2001 (JP) ............................. P.2001-231122

(51) Int. Cl.$^7$ ..................... C08G 73/10; C08F 2/50; C08F 283/04; C08F 7/038; C08F 7/027
(52) U.S. Cl. ..................... 528/170; 528/44; 528/173; 528/179; 528/182; 528/272; 528/310; 528/322; 528/353; 525/374; 525/420; 525/422; 525/425; 525/428; 525/430; 525/504; 522/1; 522/92; 522/164; 522/176; 430/56; 430/170; 430/270.1; 430/283.1; 430/286.1
(58) Field of Search .................. 528/170, 44, 52, 528/173, 179, 182, 272, 310, 322, 353; 525/374, 420, 422, 425, 428, 430, 504, 502, 507, 528, 530, 920; 522/92, 1, 164, 176; 430/56, 170, 270.1, 283.1, 286.1

(56) References Cited

U.S. PATENT DOCUMENTS

| | | | | |
|---|---|---|---|---|
| 4,690,987 A | * | 9/1987 | Sakakibara et al. | 525/502 |
| 4,803,147 A | * | 2/1989 | Mueller et al. | 430/288.1 |
| 5,281,449 A | * | 1/1994 | Iwasawa et al. | 427/510 |
| 5,589,319 A | * | 12/1996 | Katou et al. | 430/288.1 |
| 5,847,022 A | * | 12/1998 | Yamashina et al. | 522/149 |
| 5,972,807 A | * | 10/1999 | Tani et al. | 442/63 |

FOREIGN PATENT DOCUMENTS

| | | | |
|---|---|---|---|
| EP | 0601203 A1 | | 6/1994 |
| EP | 1 270 644 A1 | * | 1/2003 |
| JP | 08-283356 | | 10/1996 |
| JP | 10-246958 | | 9/1998 |
| JP | 2000-344889 | | 12/2000 |
| JP | 2000-344890 | | 12/2000 |
| JP | 2001-316436 | | 11/2001 |
| JP | 2001-323036 | | 11/2001 |
| PL | 172521 | | 11/1993 |

OTHER PUBLICATIONS

European Search Report dated Oct. 24, 2002.

* cited by examiner

*Primary Examiner*—P. Hampton Hightower
(74) *Attorney, Agent, or Firm*—Armstrong, Kratz, Quintos, Hanson & Brooks, LLP

(57) ABSTRACT

Disclosed is an active energy ray-curable polyimide resin composition which comprises a polymerizable polyimide resin (I) having an isocyanurate ring, an alicyclic structure, an imide ring and a (meth)acryloyl group and being capable of patterning with a dilute alkali aqueous solution.

11 Claims, No Drawings

ACTIVE ENERGY RAY-CURABLE POLYIMIDE RESIN COMPOSITION

FIELD OF THE INVENTION

The present invention relates to an active energy ray-curable polyimide resin composition excellent in thermal resistance, solubility in solvent, and moisture resistance under a high temperature and capable of development with a dilute alkali aqueous solution. More specifically, it relates to an active energy ray-curable polyimide resin composition most suitably usable as patterning materials including various negative resists such as a solder resist, a plating resist, or a resist for an insulating layer of a printed circuit board in build-up process or a semiconductor device.

BACKGROUND OF THE INVENTION

Since active energy ray-curable resins to be cured with ultraviolet ray or electron beam exhibit a high curing rate and are preferable in view of the protection of the environment, a substitution thereof for the conventional thermosetting resins or thermoplastic resins is in progress. Under the circumstances, improvement of thermal resistance and electric properties of the active energy ray-curable resins is demanded in various fields. At present, the active energy ray-curable resins include a wide variety of resins such as ester acrylate resins, epoxy acrylate resins, urethane acrylate resins, and the like, but there is a limitation especially on the improvement of thermal resistance.

As an active energy ray-curable resin having an improved thermal resistance, Japanese Patent Laid-Open No. 344889/2000 discloses a process for producing an active energy ray-curable polyimide resin which comprises reacting a trifunctional or more functional aromatic carboxylic acid and/or anhydride thereof, a polyisocyanate compound, and a compound having a polymerizable double bond and a hydroxyl group and/or an epoxy group. In the publication, there are descriptions that a polyimide resin excellent in thermal resistance, solubility in solvent, curability with an active energy ray, and developing property is obtained, a biuret compound or nurate compound can be used as the polyisocyanate compound to be used in the process, and an aliphatic or alicyclic polyisocyanate is preferred because an imide resin excellent in solubility in solvent and curability is obtained. Moreover, the Examples of the publication disclose a process for producing a polyimide resin using an alicyclic diisocyanate as the polyisocyanate compound.

However, although the polyimide resin obtained in the Examples of the above Japanese Patent Laid-Open No. 344889/2000 has a better thermal resistance as compared with ester acrylate resins, epoxy acrylate resins, urethane acrylate resins and the like, there remains a problem that the resistance is not sufficient yet.

SUMMARY OF THE INVENTION

An object of the invention is to provide an active energy ray-curable polyimide resin composition having a sufficient thermal resistance, capable of patterning with a dilute alkali aqueous solution, and also capable of using a common organic solvent, for example, a polar solvent having neither nitrogen atom nor sulfur atom as a solvent.

Other objects and effects of the invention will become apparent from the following description.

In consideration of the above problems, as a result of extensive studies, the present inventors found that a polymerizable polyimide resin (I) having an isocyanurate ring, an alicyclic structure, and a (meth)acryloyl group and capable of pattering with a dilute alkali aqueous solution is a resin exhibiting particularly good thermal resistance and excellent solubility in organic solvent and capable of patterning with a dilute alkali aqueous solution as well as exhibiting excellent moisture resistance even at a high temperature of 120° C. or higher, and that an active energy ray-curable polyimide resin composition suitable for the use as a resist or the like can be easily obtained by incorporating the resin. Based on the findings, the invention has been completed.

Namely, the invention provides an active energy ray-curable polyimide resin composition which comprises a polymerizable polyimide resin (I) having an isocyanurate ring, an alicyclic structure, an imide ring, and a (meth) acryloyl group, and being capable of patterning with a dilute alkali aqueous solution.

DETAILED DESCRIPTION OF PREFERRED EMBODIMENTS

The present invention is described in detail below.

The polymerizable polyimide resin (I) to be used in the invention may be any polymerizable polyimide resin having an isocyanurate ring, an alicyclic structure, an imide ring, and a (meth)acryloyl group, and capable of patterning with a dilute alkali aqueous solution, and is not particularly limited. For example, there is mentioned a polymerizable polyimide resin having a concentration of isocyanurate ring of 0.4 to 1.2 mmol/g (based on resin solid matter), a concentration of (meth)acryloyl group of 0.3 to 4 mmol/g (based on resin solid matter), an acid value of 20 to 250 (based on resin solid matter), a number average molecular weight of 1,000 to 20,000, and a weight average molecular weight of 1,500 to 30,000.

Of these polymerizable polyimide resins, because of a satisfactory solubility in organic solvent and thermal resistance and easy patterning with a dilute alkali aqueous solution when used for a resist, particularly preferred is a polyimide resin having a concentration of isocyanurate ring of 0.6 to 1.1 mmol/g, a concentration of (meth)acryloyl group of 0.7 to 3 mmol/g, an acid value of 50 to 180, a number average molecular weight of 1,500 to 6,000, and a weight average molecular weight of 3,000 to 15,000.

The isocyanurate ring in the above polyimide resin (I) is preferably an isocyanurate ring derived from an isocyanurate ring-containing polyisocyanate compound derived from an alicyclic diisocyanate compound. In this case, the polymerizable polyimide resin to be used in the invention may usually have 2 or 3 molar equivalents of the alicyclic structure derived from the alicyclic diisocyanate compound per 1 mol of the isocyanurate ring. Of the resins, the resin having 2.5 to 3 molar equivalents of the alicyclic structure is more preferred, and the resin having higher molar equivalents is more desirable.

By the way, in the invention, the concentration of isocyanurate ring, concentration of (meth)acryloyl group, acid value, number average molecular weight, and weight average molecular weight of the polymerizable polyimide resin (I) having an aliphatic structure are measured according to the following methods.

(1) Concentration of Isocyanurate Ring:

Based on $^{13}C$-NMR analysis [solvent: deuterated dimethyl sulfoxide (DMSO-$d_6$)], the concentration (mmol) of isocyanurate ring per g of the polymerizable polyimide resin (I) is determined from the spectral strength of the carbon atom at 149 ppm ascribable to isocyanurate ring using a calibration curve. Also, based on $^{13}$C-NMR analysis, the concentration of imide ring can be determined from the spectral strength of the carbon atom at 169 ppm ascribable to imide ring.

(2) Concentration of (Meth)Acrylate Group:

Using the relation that 160 g of bromine is theoretically added to 1 mol of an unsaturated bond, the concentration (mmol) of (meth)acryloyl group per g of the polymerizable polyimide resin (I) is calculated based on the measurement of bromine value of the polyimide (I). The bromine value is measured in accordance with the method described in JIS K-2605 and is generally designated as grams of bromine added to the unsaturated bond in 100 g of a sample, so that the concentration (mmol/g) of (meth)acrylate group is determined by dividing the resulting bromine value by 16.

(3) Acid Value:

It is measured in accordance with JIS K-5601-2-1. By the way, as the solvent for diluting the sample, a mixed solvent of acetone/water (volume ratio of 9/1) having an acid value of 0 is used so that the acid value of an acid anhydride can be also measured.

(4) Number Average Molecular Weight and Weight Average Molecular Weight:

The number average molecular weight and weight average molecular weight in terms of polystyrene are determined by gel permeation chromatography (GPC).

The process for producing the above polymerizable polyimide resin (I) to be used in the invention is not particularly limited, but one example includes a method of reacting a polyisocyanate compound (A) containing an isocyanurate ring-containing polyisocyanate compound (A1) derived from an alicyclic diisocyanate compound and/or a urethane prepolymer (A2) having an isocyanate group at the terminal obtainable from the polyisocyanate compound (A1) and a polyol compound (a2) with an anhydride (B) of polycarboxylic acid in an organic solvent, and successively with a compound (C1) having a (meth)acryloyl group and a hydroxyl group and/or a compound (C2) having a (meth)acryloyl group and an epoxy group.

The polyisocyanate compound (A) to be used in the process may be any one containing an isocyanurate ring-containing polyisocyanate compound (A1) derived from an alicyclic diisocyanate compound and/or a urethane prepolymer (A2) having an isocyanate group at the terminal obtainable from the polyisocyanate compound (A1) and a polyol compound (a2). Furthermore, if necessary, the compound (A) may contain a polyisocyanate compound (A3) other than the polyisocyanate compound (A1) and/or the urethane prepolymer (A2).

Examples of the above polyisocyanate compound (A1) include isocyanurate mixtures of an isocyanurate comprising trimer of an alicyclic diisocyanate compound, an isocyanurate comprising pentamer, an isocyanurate comprising heptamer, obtainable by isocyanuration of a diisocyanurate compound containing an alicyclic diisocyanate in the presence or absence of an isocyanuration catalyst. Of these polyisocyanate compounds (A1), the compound containing an isocyanurate comprising trimer of an alicyclic diisocyanate compound, i.e., a triisocyanate compound containing one isocyanurate ring in an amount of 30% by weight or more is preferred since a polymerizable polyimide resin excellent in thermal resistance and moisture resistance is obtained. Furthermore, the compound containing the triisocyanate compound in an amount of 50% by weight or more, for example 50 to 95% by weight is particularly preferred since a polymerizable polyimide resin easy to produce and excellent in thermal resistance and moisture resistance under a high temperature and a high pressure is obtained.

As the above diisocyanate compound containing the alicyclic diisocyanate compound, there may be mentioned a compound containing a diisocyanate compound other than an alicyclic diisocyanate compound, for example acyclic aliphatic diisocyanate compound in an amount of 50% by weight or less or a compound containing an aromatic diisocyanate in an amount of 30% by weight or less. Of these, since a polymerizable polyimide resin excellent in thermal resistance and solubility in solvent is obtained, preferred is the compound having a high content of the alicyclic diisocyanate compound, and usually, a compound having a content of the alicyclic diisocyanate compound of 100% by weight is used. Examples of the alicyclic diisocyanate compound include isophorone diisocyanate, 4,4'-methylenebis(cyclohexyl isocyanate), 1,3-bis(isocyanatomethyl)cyclohexane, and norbornene diisocyanate. Moreover, examples of the acyclic aliphatic diisocyanate include hexamethylene diisocyanate, lysine diisocyanate, and trimethylhexane diisocyanate. These compounds may be used solely or as a mixture of two or more of them.

Furthermore, the above polyisocyanate compound (A1) preferably contains an isocyanate group in an amount of 5 to 30% by weight since a polymerizable polyimide resin satisfactory in thermal resistance and solubility in solvent is obtained. Particularly, the compound more preferably contains an isocyanate group in an amount of 10 to 20% by weight.

As the urethane prepolymer (A2), a urethane prepolymer having an isocyanate group at the terminal obtainable by reacting the above polyisocyanate compound (A1) and a polyol compound (a2) in the molar ratio so that the isocyanate group in the polyisocyanate compound (A1) is in excess of the hydroxyl group in the polyol compound (a2) may be mentioned.

The above polyol compound (a2) may be any polyol compound having two or more hydroxyl groups in one molecule and is not particularly limited. Of the compounds, preferred is a compound having two to six hydroxyl groups, and particularly preferred is a diol compound. The polyol compound (a2) is introduced into the resin through a urethane bond with the polyisocyanate compound (A1). Such introduction of the polyol compound (a2) into an imide skeleton results in improvement of solubility in solvent of the imide resin and also satisfactory performance such as developing speed and developing stability at development.

In general, the introduction of the urethane bond is considered as a cause of deterioration of thermal resistance, but in the urethane modification with the above polyol compound (a2), the deterioration of thermal resistance of an imide resin is prevented because the compound is directly bound to an isocyanurate type polyisocyanate compound and the resin has an imide bond, so that a satisfactory thermal resistance can be maintained.

Examples of such polyol compound (a2) include alkyl polyols, polyester polyols, polyether polyols, polycarbonate polyols, urethane polyols, silicon polyols, acryl polyols, and epoxy polyols.

Of these, it is preferred to use a polyol compound containing a polyol compound (a21) having a carboxyl group, i.e., a polyol compound (a21) having a carboxyl group alone or a mixture of the polyol compound (a21) and a polyol compound other than the compound as the polyol compound (a2) because of improvement of developing property and improvement of compatibility with other formulating components such as various curing agents.

As the above polyol compound (a21) having a carboxyl group, further preferred is a compound represented by the following formula (1):

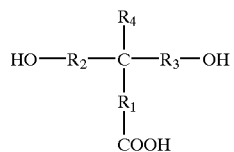

(1)

wherein $R_1$ represents a direct bond or a hydrocarbon chain having 1 to 6 carbon atoms, $R_2$ and $R_3$ may be the same or different, and each represents a hydrocarbon chain having 1 to 6 carbon atoms, and $R_4$ represents hydrogen atom or an alkyl group having 1 to 12 carbon atoms.

Examples of the compound represented by the above general formula (1) include dimethylolpropionic acid, dimethylolbutanoic acid, dimethylolpentanoic acid, dimethylolhexanoic acid, and tartaric acid.

Furthermore, as the polyol compound (a2), use can be also made of a compound having two or more hydroxyl groups, for example, an ester compound obtainable by reacting the compound represented by the above general formula (1) with ε-caprolactone, an ester compound obtainable by reacting the compound represented by the above general formula (1) with a polyol compound (a22) other than the above polyol compound (a21) or a dicarboxylic acid compound (a23), an ester compound obtainable by subjecting the compound represented by the above general formula (1) and an alkyl ester compound (a24) to an ester exchange reaction, or an ester compound obtainable by subjecting the compound represented by the above general formula (1), the above polyol compound (a22), and an alkyl ester compound (a24) to an ester exchange reaction.

Examples of the polyol compound (a22) include:

diols such as ethylene glycol, 1,3-propylene glycol, 1,2-propylene glycol, diethylene glycol, dipropylene glycol, neopentyl glycol, 1,3-butanediol, 1,4-butanediol, 1,6-hexanediol, 1,9-nonanediol, 1,10-decanediol, 2,2,4-trimethyl-1,3-pentanediol, 3-methyl-1,5-pentanediol, dichloroneopentyl glycol, dibromoneopentyl glycol, neopentyl glycol hydroxypivalate, cyclohexane dimethylol, 1,4-cyclohexanediol, spiroglycol, tricyclodecane dimethylol, hydrogenated bisphenol A, ethylene oxide-added bisphenol A, propylene oxide-added bisphenol A, dimethylolpropionic acid, and dimethylolbutanoic acid; and trifunctional or more functional polyol compounds such as trimethylolethane, trimethylolpropane, ditrimethylolethane, ditrimethylolpropane, glycerol, diglycerol, 3-methylpentane-1,3,5-triol, pentaerythritol, dipentaerythritol, tripentaerythritol, 2,2,6,6-tetramethylolcyclohexanol-1, tris(2-hydroxyethyl)isocyanurate, mannitol, sorbitol, inositol, and glucose.

Additionally, as the above dicarboxylic acid compound (a23), various dicarboxylic acids or anhydrides thereof may be used, and examples thereof include maleic acid, fumaric acid, itaconic acid, citraconic acid, tetrahydrophthalic acid, hettic acid, chrolendick acid, dimeric acid, adipic acid, succinic acid, alkenylsuccinic acid, sebacic acid, azelaic acid, 2,2,4-trimethyladipic acid, 1,4-cyclohexanedicarboxylic acid, terephthalic acid, 2-sodiumsulfoterephthalic acid, 2-potassiumsulfoterephthalic acid, isophthalic acid; 5-sodiumsulfoisophthalic acid, 5-potassiumsulfoisophthalic acid, orthophthalic acid, 4-sulfophthalic acid, 1,10-decamethylenecarboxylic acid, muconic acid, oxalic acid, malonic acid, glutaric acid, trimellitic acid, hexahydrophthalic acid, tetrabromophthalic acid, methylcyclohexenetricarboxylic acid, pyromellitic acid, and anhydrides thereof.

Furthermore, examples of the above alkyl ester compound (a24) include alkyl ester compounds of the above dicarboxylic acid compound (a23) with methanol, ethanol, butanol, or the like.

In the above process for producing the polymerizable polyimide resin, as the polyisocyanate compound (A), it is usually preferred to use the above polyisocyanate compound (A1) and/or urethane polymer (A2) alone, but one or more of a polyisocyanate compound (A3) other than these compounds may be used in combination with the compounds, if necessary.

As the polyisocyanate compound (A3), a diisocyanate compound is particularly preferred, and examples thereof include aromatic diisocyanates such as p-phenylene diisocyanate, m-phenylene diisocyanate, p-xylene diisocyanate, m-xylene diisocyanate, 2,4-tolylene diisocyanate, 2,6-tolylene diisocyanate, 4,4'-diphenylmethane diisocyanate, 3,3'-dimethyldiphenyl-4,4'-diisocyanate, 3,3'-diethyldiphenyl-4,4'-diisocyanate, and naphthalene diisocyanate; aliphatic diisocyanates such as isophorone diisocyanate, hexamethylene diisocyanate, 4,4'-methylenebis(cyclohexyl isocyanate), 1,3-bis(isocyanatomethyl)cyclohexane, norbornene diisocyanate, and lysine diisocyanate. Of these, aliphatic diisocyanates are particularly preferred.

In the case that the above polyisocyanate compound (A3) is used in combination as the polyisocyanate compound (A), the polyisocyanate compound (A3) is used in the range so that the ratio $(n_{12})/(n_3)$ of the molar amount $(n_{12})$ of isocyanate group in the above polyisocyanate compound (A1) and/or urethane prepolymer (A2) to the molar amount $(n_3)$ of isocyanate group in the above polyisocyanate compound (A3) is 1.0 or more, preferably from 1.5 to 10.5.

The anhydride (B) of polycarboxylic acid to be used in the above process for producing the polymerizable polyimide resin may be any anhydride of polycarboxylic acid having three or more carboxyl groups and is not particularly limited. Particularly, an anhydride of tricarboxylic acid or an anhydride of tetracarboxylic acid is preferred.

Examples of the anhydride of tricarboxylic acid include trimellitic anhydride and naphthalene-1,2,4-tricarboxylic anhydride.

Examples of the anhydride of tetracarboxylic acid include anhydrides of tetracarboxylic acids each having an aromatic organic group in the molecule such as pyromellitic dianhydride, benzophenone-3,4,3',4'-tetracarboxylic dianhydride, diphenyl ether-3,4,3',4'-tetracarboxylic dianhydride, benzene-1,2,3,4-tetracarboxylic dianhydride, biphenyl-3,4,3',4'-tetracarboxylic dianhydride, biphenyl-2,3,2',3'-tetracarboxylic dianhydride, naphthalene-2,3,6,7-tetracarboxylic dianhydride, naphthalene-1,2,4,5-tetracarboxylic dianhydride, naphthalene-1,8,4,5-tetracarboxylic dianhydride, decahydronaphthalene-1,8,4,5-tetracarboxylic dianhydride, 4,8-dimethyl-1,2,3,5,6,7-hexahydronaphthalene-1,2,5,6-tetracarboxylic dianhydride, 2,6-dichloronaphthalene-1,8,4,5-tetracarboxylic dianhydride, 2,7-dichloronaphthalene-1,8,4,5-tetracarboxylic dianhydride, 2,3,6,7-tetrachloronaphthalene-1,8,4,5-tetracarboxylic dianhydride, phenanthrene-1,2,9,10-tetracarboxylic dianhydride, perylene-3,4,9,10- tetracarboxylic dianhydride, bis(2,3-dicarboxyphenyl) methane dianhydride, bis(3,4-dicarboxyphenyl)methane dianhydride, 1,1-bis(2,3-dicarboxyphenyl)ethane dianhydride, 1,1-bis(3,4-dicarboxyphenyl)ethane dianhydride, 2,2-bis(2,3-dicarboxyphenyl)propane dianhydride, 2,3-bis(3,4-dicarboxyphenyl)propane dianhydride, bis(3,4-dicarboxyphenyl)sulfone dianhydride, and bis(3,4-dicarboxyphenyl)ether dianhydride. Furthermore, as the anhydride of tetracarboxylic acid, monoanhydrides are known other than these dianhydrides and may be used solely or in combination with the dianhydride. Examples of the monoanhydrides include compounds obtainable by opening the ring of one anhydride group of the dianhydride.

One or more of the above anhydrides (B) of polycarboxylic acid may be used. If necessary, an aromatic dicarboxylic acid compound and/or anhydride thereof may be further used in combination with the anhydride.

Examples of the compound (C1) having a (meth)acryloyl group and a hydroxyl group to be used in the above process for producing the polymerizable polyimide resin include various (meth)acrylate compounds having a hydroxyl group such as 2-hydroxyethyl (meth)acrylate, 2-hydroxypropyl (meth)acrylate, 2-hydroxybutyl (meth)acrylate, 3-hydroxybutyl (meth)acrylate, 4-hydroxybutyl (meth) acrylate, cyclohexanedimethanol mono(meth)acrylate, polyethylene glycol mono(meth)acrylate, polypropylene glycol mono(meth)acrylate, trimethylolpropane di(meth)acrylate, trimethylolethane di(meth)acrylate, pentaerythritol tri(meth) acrylate, dipentaerythritol tri(meth)acrylate, dipentaerythritol tetra(meth)acrylate, dipentaerythritol penta(meth) acrylate, glycidyl (meth)acrylate-(meth)acrylic acid adduct, and 2-hydroxy-3-phenoxypropyl (meth)acrylate, and ring-opening reaction products of the above acrylate compounds having a hydroxyl group with ε-caprolactone.

Moreover, as the compound (C1) having a (meth)acryloyl group and a hydroxyl group, an epoxy (meth)acrylate wherein a (meth)acrylate ester and a hydroxyl group are formed by reacting one of various epoxy compounds with (meth)acrylic acid can be used. Of these, compounds having two to five (meth)acrylate groups and one hydroxyl group are preferred.

Examples of the compound (C2) having a (meth)acryloyl group and an epoxy group include glycidyl (meth)acrylate, 2-hydroxyethyl (meth)acrylate glycidyl ether, hydroxypropyl (meth)acrylate glycidyl ether, 4-hydroxybutyl (meth) acrylate glycidyl ether, 6-hydroxyhexyl (meth)acrylate glycidyl ether, 5-hydroxy-3-methylpentyl (meth)acrylate glycidyl ether, 3,4-epoxycyclohexyl (meth)acrylate, lactone-modified 3,4-epoxycyclohexyl (meth)acrylate, and vinylcyclohexene oxide.

Moreover, as the compound (C2) having a (meth)acryloyl group and an epoxy group, use can be made of an epoxy acrylate in which an epoxy group remains, obtainable by reacting the epoxy compound (c21) having two or more epoxy groups with (meth)acrylic acid while the epoxy equivalent amount is in excess of the acryloyl equivalent amount.

Examples of such epoxy compound (c21) include bisphenol A-type epoxy resins, bisphenol S-type epoxy resins, bisphenol F-type epoxy resins, phenol novolak-type epoxy resins, cresol novolak-type epoxy resins; epoxydated products of various dicyclopentadiene-modified phenol resins obtainable by reacting dicyclopentadiene and various phenols; epoxydated products of 2,2',6,6'-tetramethylbiphenol; aromatic epoxy resins such as epoxys of naphthalene skeleton and epoxys of fluorene skeleton; aliphatic epoxy resins such as neopentyl glycol diglycidyl ether and 1,6-hexanediol diglycidyl ether; alicyclic epoxy resins such as 3,4-epoxycyclohexylmethyl-3,4-epoxycyclohexanecarboxylate and bis(3,4-epoxycyclohexyl) adipate; and epoxy resins containing a hetero ring such as triglycidyl isocyanurate.

The above compound (C1) having a (meth)acryloyl group and a hydroxyl group and/or the compound (C2) having a (meth)acryloyl group and an epoxy group each is used solely or as a mixture of two or more of each compound.

One preferred example of the process for producing the above polymerizable polyimide resin includes a process wherein the above polyisocyanate compound (A) is reacted with the above anhydride (B) of polycarboxylic acid at a temperature of 50 to 250° C. for 1 to 30 hours to synthesize an imide resin (X) containing a carboxyl group and/or an acid anhydride group, then, after the temperature is adjusted to 50 to 150° C., the compound (C1) having a (meth)acryloyl group and a hydroxyl group and/or the compound (C2) having a (meth)acryloyl group and an epoxy group are added thereto, and the whole is reacted for 1 to 30 hours to form an active energy ray-curable imide resin having a (meth)acryloyl group in the molecule.

In the above process, because of easy control of the reaction, preferred is a process wherein the polyisocyanate compound (A) is reacted with an acid anhydride having a carboxyl group as the anhydride (B) of polycarboxylic acid and successively with the compound (C1) having a (meth) acryloyl group and a hydroxyl group and/or the compound (C2) having a (meth)acryloyl group and an epoxy group, or a process wherein the polyisocyanate compound (A) is reacted with an acid anhydride having no carboxyl group as the anhydride (B) of polycarboxylic acid and successively with the compound (C1) having a (meth)acryloyl group and a hydroxyl group.

Furthermore, in the above process, in order to obtain a polymerizable polyimide resin having a sufficient solubility in solvent, thermal resistance, and alkali-developing property, the ratio $(n_b)/(n_a)$ of the total molar amount $(n_b)$ of carboxylic anhydride group and carboxyl group in the anhydride (B) of polycarboxylic acid to the molar amount $(n_a)$ of isocyanate group in the polyisocyanate compound (A) is preferably from 0.3 to 2.0, particularly preferably from 0.6 to 1.8. However, in the case that the polyisocyanate compound (A2) is used as the polyisocyanate compound (A) and the polyisocyanate compound (A2) is a urethane prepolymer having an isocyanate group at the terminal obtainable by reacting the polyisocyanate compound (A1) with a polyol compound containing the polyol (a21) having a carboxyl group, in order to obtain a polymerizable polyimide resin having a sufficient solubility in solvent, thermal resistance, and alkali-developing property, the ratio $(n_{ba2})/(n_a)$ of the total molar amount $(n_{ba2})$ of carboxylic anhydride group and carboxyl group in the anhydride (B) of polycarboxylic acid and carboxyl group in the polyisocyanate compound (A2) to the molar amount $(n_a)$ of isocyanate group in the polyisocyanate compound (A) is preferably from 0.3 to 3.0.

In the above process, the compound (C1) having a (meth) acryloyl group and a hydroxyl group or compound (C2) having a (meth)acryloyl group and an epoxy group may be added in the course of or after the completion of the reaction of the above polyisocyanate compound (A) with the above anhydride (B) of polycarboxylic acid.

However, in the case that the compound (C1) having a (meth)acryloyl group and a hydroxyl group or the compound (C2) having a (meth)acryloyl group and an epoxy group is added after the completion of the reaction, in order to avoid the danger of gelation, the polyisocyanate compound (A) and the above anhydride (B) of polycarboxylic acid are preferably used so that the above molar ratio $(n_b)/(n_a)$ or $(n_{ba2})/(n_a)$ is not in the range of 0.9 to 1.1.

Moreover, in the case that the compound (C1) having a (meth)acryloyl group and a hydroxyl group or the compound (C2) having a (meth)acryloyl group and an epoxy group is added in the course of the reaction, there are mentioned, for example, the following cases: (1) the case wherein the compound (C1) is added into the system which is in the course of the reaction and in which isocyanate group and/or acid anhydride group remain and hydroxyl group in the compound (C1) is reacted with the isocyanate group and/or acid anhydride group to form urethane bond and/or ester bond, whereby a polyimide resin, into which a reactive double bond is introduced, is obtained; (2) the case wherein the compound (C2) is added into the system which is in the course of the reaction and in which carboxyl group remains and epoxy group in the compound (C2) is reacted with the carboxyl group to form epoxyester bond, whereby a polyimide resin, into which a reactive double bond is introduced, is obtained. Of these, the above case (1) is preferred.

In the above case (1), the compound (C1) having a (meth)acryloyl group and a hydroxyl group is preferably added so that the ratio $(n_{c1})/(n_{ab})$ of the molar amount $(n_{c1})$ of hydroxyl group in the compound (C1) to the total molar amount $(n_{ab})$ of acid anhydride group and isocyanate group remaining in the reaction system is in the range of 0.5 or more, preferably 0.9 to 2.0. Moreover, in the above case (2), the compound (C2) having a (meth)acryloyl group and an epoxy group is preferably added so that the ratio $(n_{COOH})/(n_{C2})$ of the molar amount $(n_{COOH})$ of carboxyl group remaining in the reaction system to the molar amount $(n_{C2})$ of epoxy group in the compound (C2) is in the range of 1 or more, preferably 1.5 to 20.

The active energy ray-curable polyimide resin composition of the invention may be any one containing the above polymerizable polyimide resin (I), and examples thereof include those containing the above polymerizable polyimide resin (I) and an organic solvent (II). Moreover, the active energy ray-curable polyimide resin composition can be used as a resist composition when it contains an epoxy compound (III) and a photo-initiator (IV) together with the above polymerizable polyimide resin (I) and an organic solvent (II). At that time, a reactive diluent (V) may be further incorporated.

As the above organic solvent (II) and the organic solvent to be used in the above process for producing the polymerizable polyimide resin, any of various polar organic solvents may be used. Of the solvents, preferred are polar solvents capable of dissolving the polymerizable polyimide resin (I) to be used in the invention and containing neither nitrogen atom nor sulfur atom, for example, ether solvents, ester solvents, and ketone solvents, and particularly preferred are ether solvents. By the way, the organic solvent (II) and the organic solvent to be used in he above process for producing the polymerizable polyimide resin are preferably the same or solvents each containing the same solvent as a major component.

As the above ether solvents, various kinds of the solvents can be used, and examples thereof include ethylene glycol dialkyl ethers such as ethylene glycol dimethyl ether; polyethylene glycol dialkyl ethers such as diethylene glycol dimethyl ether; ethylene glycol monoalkyl ether acetates such as ethylene glycol monomethyl ether acetate; polyethylene glycol monoalkyl ether acetates such as diethylene glycol monomethyl ether acetate; polypropylene glycol dialkyl ethers such as propylene glycol dimethyl ether; propylene glycol monoalkyl ether acetates such as propylene glycol monomethyl ether acetate; and polypropylene glycol monoalkyl ether acetates such as dipropylene glycol monomethyl ether acetate. Of these, preferred are polyethylene glycol monoalkyl ether acetates and polypropylene glycol monoalkyl ether acetates.

Additionally, examples of the ester solvents include ethyl acetate and butyl acetate and examples of the ketone solvents include acetone, methyl ethyl ketone, and cyclohexanone.

Because a composition excellent in coating property is obtained, the amount of the above organic solvent (II) is such an amount that the content in the active energy ray-curable polyimide resin composition of the invention is in the range of preferably 10 to 80% by weight, particularly 20 to 70% by weight. Moreover, the amount of the organic solvent to be used in the above process for producing the polymerizable polyimide resin is such an amount that the content in the system after the completion of the reaction is in the range of preferably 10 to 70% by weight, particularly 20 to 60% by weight.

In the process of producing the above polymerizable polyimide resin, at the time when the polyimide resin (X) is obtained by reacting the polyisocyanate compound (A) with the anhydride (B) of polycarboxylic acid, the molecular weight and acid value of the resulting imide resin (X) can be regulated by changing the weight ratio of the polyisocyanate compound (A) to the anhydride (B) of polycarboxylic acid. Moreover, at the reaction of the polyisocyanate compound (A) with the anhydride (B) of polycarboxylic acid, an imidation catalyst or the like may be used and an antioxidant or a polymerization inhibitor may be further used.

Furthermore, the molecular weight can be regulated by reacting the carboxyl group or acid anhydride group remaining at the terminal of the above polyimide resin (X) with an epoxy resin having two or more epoxy groups in the molecule. As such an epoxy resin, the above epoxy compound (c21) can be used.

The reaction of the above polyimide resin (X) containing a carboxyl group and/or an acid anhydride group with the compound (C1) having a (meth)acryloyl group and a hydroxyl group includes (1) a ring-opening esterification reaction (half-esterification reaction) of hydroxyl group in the compound (C1) with acid anhydride group remaining in the polyimide resin (X), (2) an esterification reaction of hydroxyl group in the compound (C1) with carboxyl group remaining in the polyimide resin (X), and (3) a reaction of isocyanate group remaining in the polyimide resin (X) with hydroxyl group in the compound (C1). By these reactions, (meth)acryloyl group is introduced into the polyimide resin (X) to obtain a polymerizable polyimide resin.

Moreover, the reaction of the above polyimide resin (X) containing a carboxyl group and/or an acid anhydride group with the compound (C2) having a (meth)acryloyl group and an epoxy group includes (1) a ring-opening esterification reaction of epoxy group in the compound (C2) with acid anhydride group remaining in the polyimide resin (X) and (2) an esterification reaction of epoxy group in the compound (C2) with carboxyl group remaining in the polyimide resin (X). By these reactions, (meth)acryloyl group is introduced into the polyimide resin (X) to obtain a polymerizable polyimide resin.

Furthermore, in the polymerizable polyimide resin obtainable by reacting the above polyimide resin (X) containing a carboxyl group and/or an acid anhydride group with the compound (C2) having a (meth)acryloyl group and an epoxy group, hydroxyl group is generated along with the ring-opening of the epoxy group. By subjecting the hydroxyl group to a half-esterification by reacting it further with an anhydride of polybasic acid, it is possible to regulate the developing property in the case of using the polyimide as a resin resist composition.

Examples of such anhydride of polybasic acid include maleic anhydride, succinic anhydride, dodecenyl succinic anhydride, phthalic anhydride, tetrahydrophthalic anhydride, hexahydrophthalic anhydride, 3-methyltetrahydrophthalic anhydride, 3-methylhexahydrophthalic anhydride, 4-methyltetrahydrophthalic anhydride, 4-methylhexahydrophthalic anhydride, and the above anhydrides (B) of polycarboxylic acids.

In the process for producing polymerizable polyimide resin, acid anhydride group and/or carboxyl group in the anhydride (B) of polycarboxylic acid are present at the molecular terminal of the imide resin. In the case that acid anhydride group is present at the molecular terminal, carboxyl group may be formed by opening the ring using water or the like.

For obtaining a cured product excellent in thermal resistance, mechanical properties, durability, and the like, the resist composition using the active energy ray-curable polyimide resin composition of the invention may contain an epoxy compound (III) as mentioned above. In this case, after curing by irradiation with an active energy ray, the epoxy compound (III) is cured by further heating. As the epoxy compound (III), the above epoxy compound (c21) can be used.

Since a resist composition excellent in thermal resistance and moisture resistance is obtained, the amount of the epoxy compound (III) to be used is preferably in the range of 10 to 300 parts by weight, particularly in the range of 15 to 200 parts by weight relative to 100 parts by weight of the polymerizable polyimide resin (I).

The above resist composition containing the epoxy compound (III) may contain a curing agent or a curing accelerator. Examples thereof include melamine, dicyandiamide, guanamine resin and derivative thereof, amines, phenols, organic phosphines, phosphonium salts, quaternary ammonium salts, anhydrides of polybasic acid, photo-cation catalysts, cyanate compounds, isocyanate compounds, and blocked isocyanate compounds.

Moreover, for curing the resist composition by irradiation with a light, a photo-initiator (IV) can be used. Examples of the photo-initiator (IV) include acetophenones, benzophenones, Michler's ketone, benzine, benzil derivatives, benzoin derivatives, benzoin methyl ethers, α-acyloxim esters, thioxanthones, anthraquinones, and various derivatives thereof.

Specific examples of the photo-initiator (IV) include 4-dimethylaminobenzoic acid, 4-dimethylaminobenzoic acid esters, alkoxyacetophenone, benzyl dimethyl ketal, benzophenone, alkyl benzoylbenzoate, bis(4-dialkylaminophenyl)ketone, benzil, benzoin; benzoin benzoate, benzoin alkyl ethers, 2-hydroxy-2-methylpropiophenone, 1-hydroxycyclohexyl phenyl ketone, thioxanthone, 2,4,6-trimethylbenzoyldiphenylphosphine oxide, bis(2,6-dimethoxybenzoyl)-2,4,4-trimethyl-pentylphosphine oxide, bis(2,4,6-trimethylbenzoyl)phenylphosphine oxide; 2-methyl-1-[4-(methylthio)phenyl]-2-morpholinopropan-1-one, 2-benzyl-2-dimethylamino-1-(4-morpholinophenyl)-butanone-1, and metallocene compounds.

Furthermore, these photo-initiators (IV) can be used in combination with various photo-sensitizers. Examples thereof include amines, ureas, sulfur-containing compounds, phosphorus-containing compounds, chlorine-containing compounds, and nitrites and other nitrogen-containing compounds.

The amount of the photo-initiator (IV) to be used is in the range of 0.5 to 25 parts by weight, preferably 1 to 15 parts by weight relative to 100 parts by weight of resin solid matter in the composition.

A reactive diluent (V) is used for the purpose of the adjustment of curability by an active energy ray, and examples thereof include (meth)acrylate compounds, vinyl compounds, acrylamide compounds, and maleimide compounds. In particular, in view of the improvement of developing property of the resist composition, a compound having a (meth)acryloyl group and a hydroxyl group is preferred.

Examples of the compound having a (meth)acryloyl group and a hydroxyl group include various (meth)acrylate compounds having a hydroxyl group such as 2-hydroxyethyl (meth)acrylate, 2-hydroxypropyl (meth)acrylate, 2-hydroxybutyl (meth)acrylate, 3-hydroxybutyl (meth)acrylate, 4-hydroxybutyl (meth)acrylate, cyclohexanedimethanol mono(meth)acrylate, polyethylene glycol mono(meth)acrylate, polypropylene glycol mono(meth)acrylate, trimethylolpropane di(meth)acrylate, trimethylolethane di(meth)acrylate, pentaerythritol tri(meth)acrylate, dipentaerythritol tri(meth)acrylate, dipentaerythritol tetra(meth)acrylate, dipentaerythritol penta(meth)acrylate, glycidyl (meth)acrylate-(meth)acrylic acid adducts, and 2-hydroxy-3-phenoxypropyl (meth)acrylate; and ring-opening reaction products of the above (meth)acrylate compounds having a hydroxyl group with ε-caprolactone.

Moreover, as the compound having a (meth)acryloyl group and a hydroxyl group, use can also be made of a compound obtainable by reacting one of various epoxy compounds with (meth)acrylic acid. The reaction of epoxy group with (meth)acrylic acid results in the ring-opening of the epoxy ring, whereby a (meth)acrylate ester and hydroxyl group are formed.

Since a resist composition excellent in photo-curability and the like is obtained, the amount of the above reactive diluent (V) to be used is preferably in the range of 10 to 200 parts by weight, in particular 10 to 100 parts by weight relative to 100 parts by weight of the active energy ray-curable imide resin (I).

Moreover, various inorganic fillers may be added to the above resist composition, if necessary. Examples thereof include barium sulfate, barium titanate, powder of silicon oxide, fine granular silicon oxide, silica, talc, clay, magnesium carbonate, calcium carbonate, aluminum oxide, aluminum hydroxide, and mica.

Furthermore, various inorganic pigments, organic pigments, and the like may be added to the above resist composition, if necessary. Examples of the inorganic pigments include chromate salts such as chrome yellow, zinc chromate, molybdate orange; ferrocyanides such as Prussian blue, titanium oxide, zinc white, red iron oxide, iron oxide; metal oxides such as carbonized chrome green, cadmium yellow, cadmium red; metal sulfide such as mercury sulfide, selenides; sulfate salts such as lead sulfate; silicate salts such as ultramarine; carbonate salts, cobalt violet; phosphate salts such as manganese violet; metal powders such as aluminum powder, zinc powder, brass powder, magnesium powder, iron powder, copper powder, nickel powder; and carbon black.

Examples of the organic pigments include azo pigments; copper phthalocyanine pigments such as phthalocyanine blue and phthalocyanine green, and quinacridone pigments.

Antirust, extender, and the like may be further added to the above resist composition, if necessary. These may be used solely or as a mixture of two or more of them, but it is necessary to use them in the range so as to have a transparency required for curing in the case that ultraviolet ray is used as an active energy ray source.

By the way, the above resist composition may contain various (meth)acrylate compounds and vinyl compounds in order to improve photo-curing properties and physical properties.

The above resist composition is applied on a substrate board and dried by removing solvent, then irradiated with an energy ray such as ultraviolet ray through a mask having a desired negative pattern, and developed with a dilute alkali aqueous solution, whereby a pattern can be formed.

As the above dilute alkali aqueous solution, a known and conventional alkali aqueous solution can be used, and representative examples thereof include aqueous solutions of sodium hydroxide, potassium hydroxide, sodium carbonate, potassium carbonate, and the like, and aqueous solution of tetramethylammonium hydroxide, tetraethylammonium hydroxide, tetramethylphosphonium hydroxide, or the like. The concentration of such alkali aqueous solution may be from 0.2 to 5% by weight. The development can be conducted by the method of dipping and shaking the coating sample in a developer or by the method of spraying the developing liquid onto a sample. Moreover, the temperature at the development is from 10 to 50° C.

The active energy ray to be used for curing the above resist composition includes an ionizing radiation or a light such as electron beam, α-ray, γ-ray, X-ray, neutron ray, or ultraviolet ray.

EXAMPLES

The present invention will be illustrated in greater detail with reference to the following Examples, but the invention should not be construed as being limited thereto. All the "part(s)" and "%" used hereinbelow are given by weight unless otherwise indicated.

Example 1

Into a four-neck flask equipped with a stirring apparatus, a thermometer, and a condenser were charged 4332.0 g of diethylene glycol monoethyl ether acetate, 2772 g of a polyisocyanate compound containing isocyanurate ring derived from isophorone diisocyanate (hereinafter, referred to as IPDI-N, the content of isocyanate group: 18.2%, the content of triisocyanate compound containing isocyanurate ring: 95%), and 1536.0 g (8 mol) of trimellitic anhydride, and the whole was heated to 160° C. under stirring. It began to foam vigorously at around 60° C. and the content in the flask became gradually transparent. The whole was reacted at 160° C. for 4 hours and cooled to 80° C. at the time when the content of isocyanate group in the system reached 2.0%. Then, 935.0 g of diethylene glycol monoethyl ether acetate and 3.51 g of methylhydroquinone were added and further 935.0 g (2 mol) of pentaerythritol triacrylate (hydroxyl value: 120) was added thereto, followed by reaction at 80° C. while care was taken to heat generation. After 4 hours of the reaction at 80° C., disappearance of the absorption of isocyanate group at 2270 $cm^{-1}$ was confirmed on infrared absorption spectrum (hereinafter, abbreviated as IR), and a pale yellow transparent polymerizable polyimide resin solution was obtained.

When the polyimide resin solution was applied onto a KBr plate and IR of the sample after evaporation of the solvent was measured, the following absorption was ascertained: absorption of imide ring at 1780 $cm^{-1}$ and 735 $cm^{-1}$; absorption of amide group at 1660 $cm^{-1}$, absorption of acid anhydride group at 1850 $cm^{-1}$, 1780 $cm^{-1}$, and 720 $cm^{-1}$; absorption of carboxyl group at 3390 $cm^{-1}$; and furthermore, absorption of acryloyl group at 1638 $cm^{-1}$ and 810 $cm^{-1}$. Moreover, the concentration of isocyanurate ring was found to be 0.87 mmol/g (based on resin solid matter) based on $^{13}$C-NMR analysis and it was confirmed as an acrylate containing imide ring and amide group. By the way, in the measurement of the molecular weight by GPC, the number average molecular weight (hereinafter, abbreviated as Mn) was found to be 2,000 in terms of polystyrene, and the weight average molecular weight (hereinafter, abbreviated as Mw) was found to be 4,020 in terms of polystyrene. The acid value was 76.7 (based on resin solid matter) and the concentration of acryloyl group was 1.25 mmol/g (based on resin solid matter). Hereinafter, this polyimide resin solution is abbreviated as a resin solution P1.

Using the thus-obtained resin solution P1, a resist ink was prepared by formulating it as the composition shown in Table 1(1) and kneading the mixture in a dispersing machine (T.K. Homo Disper: TOKYUSHU KIKA KOUGYOU CO., LTD.). Then, using the resist ink, test pieces each having a resist ink-coated film on a tin plate or a glass epoxy printed circuit board wherein an etched circuit pattern had been formed beforehand were prepared, and evaluation tests of the following (1) to (4) were conducted. The evaluation results are shown in Table 2(1).

<Methods for Evaluation Tests>
(1) Re-dissolution Test

The resist ink was applied on a tin plate by means of 0.076 mil applicator so that the film thickness became 30 μm after drying. The resulting test piece was allowed to stand in a drying chamber of 80° C. for 30 minutes to form a test piece having a resist ink-coated film from which the solvent was evaporated. After the weight and the applied area were measured, the test piece was dipped and shaken at 50° C. for 30 seconds in either 1% sodium carbonate aqueous solution or 1% sodium hydroxide aqueous solution to re-dissolve the coated film. The test piece was dried and the weight was measured. From the weight before the re-dissolution, the weight after the re-dissolution, the applied area, and the specific gravity of the coated film (provided that the specific gravity was regarded as 1.2), the thickness of the coated film re-dissolved within 60 seconds was calculated and then a film-decreasing speed was determined. The large value of the film-decreasing speed shows excellence in re-dissolution property.

(2) Evaluation of Curability with Ultraviolet Ray and Patterning Property

The resist ink was applied on a tin plate by means of 0.076 mil applicator so that the film thickness became 30 μm after drying. The resulting test piece was allowed to stand in a drying chamber of 80° C. for 30 minutes to form a test piece having a resist ink-coated film from which the solvent was evaporated. A step tablet No. 2 (manufactured by Kodak K.K.) was placed on the coated film, and coated film of each test piece was irradiated with an ultraviolet ray of either 500 $mJ/cm^2$ or 1000 $mJ/cm^2$ by means of a high pressure mercury lamp. Each coated film was dipped and shaken at 50° C. for 60 seconds in 1% sodium hydroxide aqueous solution to re-dissolve the film, and the evaluation was conducted on the remaining steps without re-dissolution. The evaluation was shown by the number of steps of the step tablet. The large number of steps shows excellence in curability with ultraviolet ray and patterning property.

(3) Measurement of Glass Transition Temperature and Linear Expansion Coefficient The resist ink was applied on a tin plate by means of 0.076 mil applicator so that the film thickness became 30 μm after drying. The resulting test piece was allowed to stand in a drying chamber of 80° C. for 30 minutes to form a test piece having a resist ink-coated film from which the solvent was evaporated. The coated film was irradiated with an ultraviolet ray of 500 mJ/cm$^2$ by means of a high pressure mercury lamp. Thereafter, each test piece was allowed to stand for 60 minutes in drying chambers of 150° C. and 170° C., separately to cure the films, and then the cured films were peeled off. Then, the glass transition temperature (Tg) and linear expansion coefficient (αl) of each resulting cured coated film was measured under conditions of a sample length of 10 mm, a temperature-elevating rate of 10° C./minute, a load of 49 mN (5 g) using a thermal analysis system TMA-SS6000 manufactured by Seiko Denshi K.K. according to TMA (Thermal mechanical analysis) method. With regard to the glass transition temperature (Tg), the high value of the temperature shows excellence in thermal resistance. Moreover, the linear expansion coefficient (αl) means dimensional stability lower than the glass transition temperature (Tg), and the small value shows excellence in thermal dimensional stability.

(4) Pressure Cooker Test (PCT)

The resist ink was applied on a glass epoxy printed circuit board wherein an etched circuit pattern had been formed beforehand by means of 0.076 mil applicator so that the film thickness became 30 μm after drying. The resulting test piece was allowed to stand in a drying chamber of 80° C. for 30 minutes to form a test piece having a resist ink-coated film from which the solvent was evaporated. The coated film was irradiated with an ultraviolet ray of 500 mJ/cm$^2$ by means of a high pressure mercury lamp. Thereafter, each test piece was allowed to stand for 60 minutes in drying chambers of 150° C. and 170° C., separately to form a test piece having a coated film. Then, each resulting test piece was treated at 121° C. for 50 hours under saturated vapor pressure of 100% RH on a PCT test machine (PC-304RIII manufactured by K.K. Hirayama Seisakusho). Thereafter, the test piece was placed again under a room temperature condition and change of the appearance was visually evaluated. Moreover, in accordance with the cellophane tape peeling test of JIS D-0202, the resulting coated film was cross-cut in a grid form at 1 mm intervals, a peeling test was conducted by means of cellophane tape, the number of peeled cuts of the coated film was counted, and the adhesion of the coated film was evaluated according to the following standard.

(1) Standard for Appearance Evaluation

A: Neither change nor abnormality is observed before and after the PCT test.

B: After the PCT test, abnormality of the coated film, such as blister, whitening, and dissolution, is confirmed in the range of less than 10% of the area of the coated film.

C: After the PCT test, abnormality of the coated film, such as blister, whitening, and dissolution, is confirmed in the range of from 10% to less than 50% of the area of the coated film.

D: After the PCT test, abnormality of the coated film, such as blister, whitening, and dissolution, is confirmed in the range of 50% or more of the area of the coated film.

(2) Evaluation of Adhesion

A: No peeling is observed in the grid.

B: The number of peeled cuts in the grid is less than 20 relative to 100 cuts in the grid.

C: The number of peeled cuts in the grid is from 20 to less than 70 relative to 100 cuts in the grid.

D: The number of peeled cuts in the grid is 70 or more relative to 100 cuts in the grid.

Example 2

Into a four-neck flask equipped with a stirring apparatus, a thermometer, and a condenser were charged 3979.5 g of diethylene glycol monoethyl ether acetate, 2097.0 g of IPDI-N (the molar amount of isocyanate group: 9 mol), 538.5 g (the molar amount of isocyanate group: 3 mol) of a polyisocyanate compound containing isocyanurate ring derived from hexamethylene diisocyanate (the content of isocyanate group: 23.4%, the content of triisocyanate compound containing isocyanurate ring: 60%), and 1344.0 g (7 mol) of trimellitic anhydride, and the whole was heated to 160° C. under stirring. It began to foam vigorously at around 60° C. and the content in the flask became gradually transparent. The whole was reacted at 160° C. for 4 hours and cooled to 80° C. at the time when the content of isocyanate group in the system reached 1.1%. Then, 935.0 g of diethylene glycol monoethyl ether acetate and 3.56 g of methylhydroquinone were added and further 935.0 g (2 mol) of pentaerythritol triacrylate (hydroxyl value: 120) was added thereto, followed by reaction at 80° C. After 4 hours of the reaction at 80° C., disappearance of the absorption of isocyanate group at 2270 cm$^{-1}$ was confirmed on IR, and a pale yellow transparent polymerizable polyimide resin solution was obtained.

When the polyimide resin solution was applied onto a KBr plate and IR of the sample after evaporation of the solvent was measured, the following absorption was ascertained: absorption of imide ring at 1780 cm$^{-1}$ and 735 cm$^{-1}$; absorption of amide group at 1660 cm$^{-1}$, absorption of acid anhydride group at 1850 cm$^{-1}$, 1780 cm$^{-1}$, and 720 cm$^{-1}$; absorption of carboxyl group at 3390 cm$^{-1}$; and furthermore, absorption of acryloyl group at 1638 cm$^{-1}$ and 810 cm$^{-1}$. Moreover, Mn was found to be 2,000, Mw 4,600, the acid value 76.7, and the concentration of acryloyl group 1.42 mmol/g. Furthermore, the concentration of isocyanurate ring was found to be 0.96 mmol/g. Hereinafter, this polyimide resin solution is abbreviated as a resin solution P2.

A resist ink was prepared in a similar manner to Example 1 with the exception that the thus-obtained resin solution P2 was used instead of the resin solution P1, and then, evaluation tests of the above (1) to (4) were conducted. The evaluation results are shown in Table 2(1).

Example 3

Into a four-neck flask equipped with a stirring apparatus, a thermometer, and a condenser were charged 4524.0 g of diethylene glycol monoethyl ether acetate, 2797.0 g of IPDI-N (the molar amount of isocyanate group: 12 mol), and 1728.0 g (9 mol) of trimellitic anhydride, and the whole was heated to 160° C. under stirring. It began to foam vigorously at around 60° C. and the content in the flask became gradually transparent. The whole was reacted at 160° C. for 7 hours and cooled to 80° C. at the time when the content of isocyanate group in the system reached 0.1%. Then, 355.0 g of diethylene glycol monoethyl ether acetate and 2.18 g of methylhydroquinone were added and further 355.0 g (2.5 mol) of glycidyl methacrylate and 10.0 g of triphenylphosphine were added thereto, followed by reaction at 100° C. After 5 hours of the reaction at 100° C., the epoxy equivalent weight was confirmed to be 15000 g/eq or more and a pale yellow transparent polymerizable polyimide resin solution was obtained.

When the polyimide resin solution was applied onto a KBr plate and IR of the sample after evaporation of the solvent was measured, the following absorption was ascertained: absorption of imide ring at 1780 cm$^{-1}$ and 735 cm$^{-1}$; absorption of amide group at 1660 cm$^{-1}$, absorption of acid anhydride group at 1850 cm$^{-1}$, 1780 cm$^{-1}$, and 720 cm$^{-1}$; absorption of carboxyl group at 3390 cm$^{-1}$; and furthermore, absorption of acryloyl group at 1638 cm$^{-1}$ and 810 cm$^{-1}$. Moreover, Mn was found to be 2,900, Mw 6,500, the acid value 74.2, and the concentration of acryloyl group 0.57 mmol/g. Furthermore, the concentration of isocyanurate ring was found to be 0.92 mmol/g. Hereinafter, this polyimide resin solution is abbreviated as a resin solution P3.

A resist ink was prepared in a similar manner to Example 1 with the exception that the thus-obtained resin solution P3 was used instead of the resin solution P1, and then, evaluation tests of the above (1) to (4) were conducted. The evaluation results are shown in Table 2(1).

Example 4

Into a four-neck flask equipped with a stirring apparatus, a thermometer, and a condenser were charged 4151.5 g of diethylene glycol monoethyl ether acetate, 2077.0 g of IPDI-N (the molar amount of isocyanate group: 9 mol), 538.5 g (the molar amount of isocyanate group: 3 mol) of a triusocyanate compound containing isocyanurate ring derived from hexamethylene diisocyanate (the content of isocyanate group: 23.4%, the content of triisocyanate compound containing isocyanurate ring: 60%), and 1536.0 g (8 mol) of trimellitic anhydride, and the whole was heated to 160° C. under stirring. It began to foam vigorously at around 60° C. and the content in the flask became gradually transparent. The whole was reacted at 160° C. for 4 hours and cooled to 80° C. at the time when the content of isocyanate group in the system reached 1.1%. Then, 935.0 g of diethylene glycol monoethyl ether acetate and 3.56 g of methylhydroquinone were added and further 935.0 g (2 mol) of pentaerythritol triacrylate (hydroxyl value: 120) was added thereto, followed by reaction at 80° C. After 4 hours of the reaction at 80° C., disappearance of the absorption of isocyanate group at 2270 cm$^{-1}$ was confirmed on IR, and a pale yellow transparent polymerizable polyimide resin solution was obtained.

When the polyimide resin solution was applied onto a KBr plate and IR of the sample after evaporation of the solvent was measured, the following absorption was ascertained: absorption of imide ring at 1780 cm$^{-1}$ and 735 cm$^{-1}$; absorption of amide group at 1660 cm$^{-1}$, absorption of acid anhydride group at 1850 cm$^{-1}$, 1780 cm$^{-1}$, and 720 cm$^{-1}$; absorption of carboxyl group at 3390 cm$^{-1}$; and furthermore, absorption of acryloyl group at 1638 cm$^{-1}$ and 810 cm$^{-1}$. Moreover, Mn was found to be 2,110, Mw 4,400, the acid value 77.6, and the concentration of acryloyl group 1.28 mmol/g. Furthermore, the concentration of isocyanurate ring was found to be 0.93 mmol/g. Hereinafter, this polyimide resin solution is abbreviated as a resin solution P4.

A resist ink was prepared in a similar manner to Example 1 with the exception that the thus-obtained resin solution P4 was used instead of the resin solution P1, and then, evaluation tests of the above (1) to (4) were conducted. The evaluation results are shown in Table 2(1).

Comparative Example 1

Into a flask equipped with a stirring apparatus, a thermometer, and a condenser was charged 322.2 g of ethylcarbitol acetate, and 954.0 g of an o-cresol novolak epoxy resin EPICLON N-680 [manufactured by Dainippon Ink & Chemicals, Incorporated, epoxy equivalent weight: 212 g/eq] was dissolved therein. Then, 1.3 g of hydroquinone was added and then, 325.8 g of acrylic acid and 4.25 g of N,N-dimethylbenzylamine were added under stirring, followed by esterification reaction at 115° C. while air was blowing therein. The reaction was terminated at the point when the acid value decreased to 1 mgKOH/g or less. Thereafter, 611.2 g of ethylcarbitol acetate and 444.6 g of tetrahydrophthalic anhydride were added thereto, followed by 5 hours of reaction at 90° C. to obtain a pale yellow acid-pendant type epoxyacrylate resin solution. The acid value was found to be 82.4, and the concentration of acryloyl group 2.61 mmol/g. Moreover, Mn was found to be 3,500, and Mw 9,800. Hereinafter, this epoxy acrylate resin solution is abbreviated as a resin solution 1'.

Using the thus-obtained resin solution 1', a resist ink was prepared by formulating it as the composition shown in Table 1(1) and kneading the mixture in a dispersing machine (T.K.Homo Disper: TOKYUSHU KIKA KOUGYOU CO., LTD.). Then, using the resist ink, test pieces each having a resist ink-coated film on a tin plate or a glass epoxy printed circuit board wherein an etched circuit pattern had been formed beforehand were prepared, and evaluation tests of the above (1) to (4) were conducted. The evaluation results are shown in Table 2(2).

Comparative Example 2

Into a four-neck flask equipped with a stirring apparatus, a thermometer, and a condenser were charged 195.4 g of diethylene glycol monoethyl ether acetate, 111.0 g of isophorone diisocyanate, and 134.4 g of trimellitic anhydride, and the whole was heated to 80° C. under stirring under a nitrogen atmosphere. It began to foam vigorously at around 60° C. and the content in the flask became gradually transparent. The whole was reacted at 80° C. for 1 hour and then heated to 150° C. Furthermore, the whole was reacted at 150° C. for 7 hours. The whole was cooled to 100° C. and the atmosphere was changed to air atmosphere, and then 0.22 g of methylhydroquinone was added. After cooling to 100° C., 37.4 g of pentaerythritol triacrylate (hydroxyl value: 120) was charged thereinto and the whole was reacted at 100° C. for 3 hours to obtain a pale yellow polymerizable polyimide resin solution. The acid value was found to be 100.9, and the concentration of acryloyl group 0.98 mmol/g. Moreover, Mn was found to be 1,700, and Mw 2,050. Hereinafter, this epoxy acrylate resin solution is abbreviated as a resin solution 2'.

A resist ink was prepared in a similar manner to Comparative Example 1 with the exception that the thus-obtained resin solution 2' was used instead of the resin solution 1', and then, evaluation tests of the above (1) to (4) were similarly conducted. The evaluation results are shown in Table 2(2).

TABLE 1 (1)

| | Example | | | |
|---|---|---|---|---|
| Item | 1 | 2 | 3 | 4 |
| Resin solution P1 (part) | 27.1 | | | |
| Resin solution P2 (part) | | 27.8 | | |
| Resin solution P3 (part) | | | 27.2 | |
| Resin solution P4 (part) | | | | 27.0 |
| EPICLON N-680 [1] (part) | 5.6 | 4.9 | 5.5 | 5.6 |
| Dipentaerythritol hexaacrylate (part) | 1.4 | 1.5 | 1.4 | 1.4 |

TABLE 1 (1)-continued

| | Example | | | |
|---|---|---|---|---|
| Item | 1 | 2 | 3 | 4 |
| 2-Methyl-1-[4-(methylthio) phenyl]-2-morpholinopropanone-1 (part) | 0.94 | 1.0 | 0.9 | 0.9 |

TABLE 1 (2)

| | Example | |
|---|---|---|
| Item | 1 | 2 |
| Resin solution P1' (part) | 39.5 | |
| Resin solution P2' (part) | | 24.0 |
| EPICLON N-680 *1) (part) | 7.0 | 8.2 |
| Dipentaerythritol hexaacrylete (part) | 2.4 | 1.7 |
| 2-Methyl-1-[4-(methylthio) phenyl]-2-morpholinopropanone-1 (part) | 1.74 | 1.12 |

Footnote for Table 1 (1) and Table 1 (2)
*1) EPICLON N-680: o-cresol novolak epoxyresin (manufactured by Dainippon Ink & Chemicals, Incorporated, epoxy equivalent weight: 212)

TABLE 2 (1)

| | Example | | | |
|---|---|---|---|---|
| Item | 1 | 2 | 3 | 4 |
| Re-solubility | | | | |
| sodium carbonate ($\mu$m/min) | 7.5 | 25.5 | 5.2 | 4.1 |
| sodium hydroxide ($\mu$m/min) | 32.4 | 27.1 | 41.9 | 21.1 |
| UV curability | | | | |
| 500 mJ/cm$^2$ | 4 steps | 4 steps | 3 steps | 5 steps |
| 1000 mJ/cm$^2$ | 7 steps | 6 steps | 6 steps | 9 steps |
| Tg | | | | |
| cured at 150° C. (° C.) | 153 | 176 | 172 | 176 |
| cured at 170° C. (° C.) | 165 | 195 | 187 | 195 |
| α1 | | | | |
| cured at 150° C. (10$^{-6}$/° C.) | 79 | 71 | 82 | 71 |
| cured at 170° C. (10$^{-6}$/° C.) | 66 | 40 | 71 | 40 |
| PCT test | | | | |
| Appearance | | | | |
| cured at 150° C. | A | B | B | A |
| cured at 170° C. | A | C | B | C |
| Adhesion | | | | |
| cured at 150° C. | A | B | B | A |
| cured at 170° C. | A | C | B | B |

TABLE 2 (2)

| | Comparative Example | |
|---|---|---|
| Item | 1 | 2 |
| Re-solubility | | |
| sodium carbonate ($\mu$m/min) | 39.8 | 22.3 |
| sodium hydroxide ($\mu$m/min) | 82.3 | 59.2 |
| UV curability | | |
| 500 mJ/cm$^2$ | 7 steps | 4 steps |
| 1000 mJ/cm$^2$ | 9 steps | 5 steps |
| Tg | | |
| cured at 150° C. (° C.) | 85 | 126 |
| cured at 170° C. (° C.) | 101 | 129 |
| α1 | | |
| cured at 150° C. (10$^{-6}$/° C.) | 68 | 95 |
| cured at 170° C. (10$^{-6}$/° C.) | 63 | 91 |
| PCT test | | |
| Appearance | | |
| cured at 150° C. | D | D |
| cured at 170° C. | D | D |
| Adhesion | | |
| cured at 150° C. | D | C |
| cured at 170° C. | D | D |

Example 5

Into a four-neck flask equipped with a stirring apparatus, a thermometer, and a condenser were charged 5200 g of diethylene glycol monoethyl ether acetate, 2772 g of IPDI-N (the molar amount of isocyanate group: 12 mol), and 148 g (1 mol) of dimethylolbutanoic acid, and the whole was heated to 80° C. under stirring while care was taken to heat generation, followed by 3 hours of reaction. Then, 1344 g (7 mol) of trimellitic anhydride was charged and the whole was heated to 160° C. The reaction proceeded along with foaming. The whole was reacted at the temperature for 4 hours. The system became a pale brown transparent liquid. The solution was cooled to 100° C. and further, 935 g (2 mol) of pentaerythritol triacrylate (hydroxyl value: 120) and 15 g of methylhydroquinone were charged thereinto, followed by 5 hours of urethanization reaction at the temperature. Disappearance of the absorption of isocyanate group at 2270 cm$^{-1}$ was confirmed on IR, and a pale brown transparent polymerizable polyimide resin solution was obtained.

When the polyimide resin solution was applied onto a KBr plate and IR of the sample after evaporation of the solvent was measured, the following absorption was ascertained: absorption of imide ring at 725 cm$^{-1}$, 1780 cm$^{-1}$, and 1720 cm$^{-1}$; characteristic absorption of isocyanurate ring at 1690 cm$^{-1}$ and 1460 cm$^{-1}$; and furthermore, absorption of urethane bond at 1550 cm$^{-1}$. Moreover, Mn was found to be 2,500, Mw 5,200, the acid value 98, and the concentration of acryloyl group 1.23 mmol/g. Furthermore, the concentration of isocyanurate ring was found to be 0.85 mmol/g. Hereinafter, this polyimide resin solution is abbreviated as a resin solution P5.

Using the thus-obtained resin solution P5, a negative type resist ink was prepared by formulating it as the following composition and kneading the mixture in a dispersing machine (T.K.Homo Disper: TOKYUSHU KIKA KOUGYOU CO., LTD.). Evaluation tests of the following (5) to (9) were conducted. The evaluation results are shown in Table 3.

Formulation Composition:

| | |
|---|---|
| (1) a polymerizable polyimide resin solution (resin solid matter) | 75 parts |
| (2) EPICLON N-680 *2) | 25 parts |
| (3) dipentaerythritol hexaacrylate | 10 parts |
| (4) 2-methyl-1-[4-(methylthio)phenyl]-2-morpholinopropan-1-one | 5 parts |
| (5) N,N-dimethylbenzylamine | 1 part |

Footnote for the formulation example
*2) EPICLON N-680; o-cresol novolak epoxyresin (manufactured by Dainippon Ink & Chemicals, Incorporated, epoxy equivalent weight: 216)

<Methods for Evaluation Tests>

(5) Evaluation of Finger Touch Dryness

The resist ink was applied on a glass substrate board using an applicator so that the film thickness became 30 μm after drying, and the whole was dried at 80° C. for 30 minutes to obtain a test piece. The test piece was allowed to stand for 1 hour in an environment of 25° C. and 65% RH. Thereafter, tackiness at touching the coated film with a finger was evaluated according to the following standard.

Evaluation Standard

A: No tackiness is observed.
B: A slight tackiness is observed.
C: A remarkable tackiness is observed.
D: The resin adheres to the finger.

(6) Evaluation of Curability with Ultraviolet Ray

The resist ink was applied on a glass substrate board using an applicator so that the film thickness became 30 μm after drying, and the whole was dried at 80° C. for 30 minutes to obtain a test piece. A step tablet No. 2 manufactured by Kodak K.K. was placed on the test piece, and each test piece was irradiated with an ultraviolet ray in an irradiation amount of any of 500 mJ/cm$^2$, 1000 mJ/cm$^2$, or 1500 mJ/cm$^2$ separately using a metal halide lamp (HTE106-M07 manufactured by K.K. Hitec, output: 7 Kw). The curability with ultraviolet ray was evaluated according to the following standard.

Evaluation Standard

A: Remaining region of 5 steps or more is present in an irradiation amount of 500 mJ/cm$^2$.
B: Remaining region of 5 steps or more is present in an irradiation amount of 1000 mJ/cm$^2$.
C: Remaining region of 5 steps or more is present in an irradiation amount of 1500 mJ/cm$^2$.
D: Remaining region is less than 5 steps in an irradiation amount of 1500 mJ/cm$^2$.

(7) Evaluation of Developing Property

The resist ink was applied on a glass substrate board using an applicator so that the film thickness became 30 μm after drying, and the whole was dried at 80° C. for 30 minutes to obtain a test piece. A negative resist pattern film (PCW URGA82 manufactured by UGRA) was placed on the test piece, and the test piece was irradiated with an ultraviolet ray in an irradiation amount of 1000 mJ/cm$^2$ using a metal halide lamp. Then, each test piece was dipped and shaken for 4 minutes in each developing liquid using 1% sodium carbonate aqueous solution or 1% sodium hydroxide aqueous solution as the developing liquid. After washing with tap water, developing property was visually examined by means of a loupe and evaluated according to the following standard.

Evaluation Standard

A: A concentric pattern having a diameter of 10 μm or less can be developed.
B: A concentric pattern having a diameter of 20 μm or less can be developed.
C: A concentric pattern having a diameter of 20 μm or more can be developed but undeveloped parts are observed.
D: No pattern is obtained by development.

(8) Measurement of Glass Transition Temperature and Linear Expansion Coefficient The resist ink was applied on a glass substrate board using an applicator so that the film thickness became 30 μm after drying, and the whole was dried at 80° C. for 30 minutes to obtain a test piece. The test piece was irradiated with an ultraviolet ray of 1000 mJ/cm$^2$ by means of a metal halide lamp. Thereafter, each test piece was allowed to stand for 60 minutes in drying chambers of 150° C. and 170° C., separately to cure the films, and then the cured films were peeled off. Then, the glass transition temperature (Tg) of the cured coated film was measured according to DMA (Dynamic mechanical analysis) method and the glass transition temperature (Tg) and linear expansion coefficient (αl) of the cured coated film was measured according to TMA (Thermal mechanical analysis) method. With regard to the glass transition temperature (Tg), the high value of the temperature shows excellence in thermal resistance. Moreover, the linear expansion coefficient (αl) means dimensional stability lower than the glass transition temperature (Tg), and the small value shows excellence in thermal dimensional stability.

By the way, in the DMA method, dynamic viscoelasticity was measured under conditions of jig chuck distance of 20 mm, a temperature range of 25 to 300° C., a temperature-elevating rate of 3° C./minute, and a measuring frequency of 1 Hz using RSA-II manufactured by Rheometrics Scientific, and the temperature showing maximum tan δ in the resulting spectrum was determined as the glass transition temperature (Tg).

Moreover, in TMA method, the glass transition temperature (Tg) and the linear expansion coefficient (αl) were measured under the conditions of a sample length of 10 mm, a temperature-elevating rate of 10° C./minute, a load of 49 mN (5 g) in accordance with JIS K-0129 using a thermal analysis system TMA-SS6000 manufactured by Seiko Denshi K.K.

(9) Pressure Cooker Test (PCT)

Pressure cooker test in (9) was conducted in a similar manner to the above Pressure cooker test (PCT) in the above (4) with the exception that active energy ray-curable imide resin solutions obtained in Examples 5 to 8 were used, and change of the appearance and adhesion of the coated film were evaluated.

Example 6

Into a four-neck flask equipped with a stirring apparatus, a thermometer, and a condenser were charged 4000 g of diethylene glycol monoethyl ether acetate, 2079 g of IPDI-N (molar amount of isocyanate group: 9 mol), 550 g (molar amount of isocyanate group: 3 mol) of a polyisocyanate compound containing isocyanurate ring derived from hexamethylene diisocyanate (the content of isocyanate group: 22.9%, the content of triisocyanate compound containing isocyanurate ring: 65%), and 134 g (1 mol) of dimethylolpropionic acid, and the whole was heated to 80° C. under stirring. After 5 hours of reaction at the temperature, 1152 g (6 mol) of trimellitic anhydride and 218 g (1 mol) of pyromellitic anhydride charged thereinto and the whole was heated to 170° C. The reaction proceeded along with foaming. The whole was reacted at the temperature for 4 hours. The system became a pale brown transparent liquid. The solution was cooled to 100° C. and further, 288 g (2 mol) of 4-hydroxybutyl acrylate (hydroxyl value: 390) and 15 g of methylhydroquinone were charged thereinto, followed by 5 hours of urethanization reaction at the temperature. Disappearance of the absorption of isocyanate group at 2270 cm$^{-1}$ was confirmed on IR, and a pale brown transparent polymerizable polyimide resin solution was obtained.

When the polyimide resin solution was applied onto a KBr plate and IR of the sample after evaporation of the solvent was measured, the following absorption was ascertained: absorption of imide ring at 725 cm$^{-1}$, 1780 cm$^{-1}$, and 1720 cm$^{-1}$; absorption of isocyanurate ring at 1690 cm$^{-1}$ and 1460 cm$^{-1}$; and furthermore, absorption of urethane bond at 1550 cm$^{-1}$. Moreover, Mn was found to be 2,900, Mw 4,800, the acid value 108, and the concentration of acryloyl group 0.49 mmol/g. Furthermore, the concentration of isocyanurate ring was found to be 1.07 mmol/g. Hereinafter, this polyimide resin solution is abbreviated as a resin solution P6.

A resist ink was prepared in a similar manner to Example 5 with the exception that the thus-obtained resin solution P6 was used instead of the resin solution P5, and then, evaluation tests of the above (5) to (9) were conducted. The evaluation results are shown in Table 3.

Example 7

Into a four-neck flask equipped with a stirring apparatus, a thermometer, and a condenser were charged 5500 g of propylene glycol monomethyl ether acetate, 2772 g of IPDI-N (molar amount of isocyanate group: 12 mol), and 660 g (2 mol) of an ethylene oxide adduct of bisphenol A (hydroxyl value: 340), and the whole was heated to 80° C. under stirring while care was taken to heat generation, followed by,3 hours of reaction at the temperature. Then, 1536 g (8 mol) of trimellitic anhydride was charged and the whole was heated to 130° C. The reaction proceeded along with foaming. The whole was reacted at the temperature for 12 hours. The system became a pale brown transparent liquid. Further, 568 g (4 mol) of glycidyl methacrylate, 15 g of triphenylphosphine, and 15 g of methylhydroquinone were charged thereinto, followed by 5 hours of esterification reaction at the temperature. Disappearance of the absorption of isocyanate group at 2270 cm$^{-1}$ was confirmed on IR, and a pale brown transparent polymerizable polyimide resin solution was obtained.

When the polyimide resin solution was applied onto a KBr plate and IR of the sample after evaporation of the solvent was measured, the following absorption was ascertained: absorption of imide ring at 725 cm$^{-1}$, 1780 cm$^{-1}$, and 1720 cm$^{-1}$ and absorption of isocyanurate ring at 1690 cm$^{-1}$ and 1460 cm$^{-1}$. Moreover, Mn was found to be 2,800, Mw 6,500, the acid value 75, and the concentration of acryloyl group 0.77 mmol/g. Furthermore, the concentration of isocyanurate ring was found to be 0.79 mmol/g. Hereinafter, this polyimide resin solution is abbreviated as a resin solution P7.

A resist ink was prepared in a similar manner to Example 5 with the exception that the thus-obtained resin solution P7 was used instead of the resin solution P5, and then, evaluation tests of the above (5) to (9) were conducted. The evaluation results are shown in Table 3.

Example 8

Into a four-neck flask equipped with a stirring apparatus, a thermometer, and a condenser were charged 65 g of diethylene glycol monoethyl ether acetate and 185 g of a tetramethylbiphenol-type epoxy resin (epoxy equivalent weight: 185 g/eq), and they were dissolved at 100° C. Further, 72 g of acrylic acid, 3 g of triphenylphosphine, and 5 g of methylhydroquinone were charged thereinto, followed by 10 hours of reaction at 120° C. Thereby, a resin having an acid value of 0.2 and an epoxy equivalent weight of 24000 g/eq was obtained. This resin is abbreviated as an intermediate 1.

Furthermore, into a four-neck flask equipped with a stirring apparatus, a thermometer, and a condenser were charged 4820 g of ethyl diglycol acetate, 2772 g of IPDI-N (molar amount of isocyanate group: 12 mol), and 296 g (2 mol) of dimethylolbutanoic acid, and the whole was heated to 80° C. under stirring while care was taken to heat generation. After 3 hours of reaction at the temperature, 1152 g (6 mol) of trimellitic anhydride and 436 g (2 mol) of pyromellitic dianhydride were charged and the whole was heated to 140° C. The reaction proceeded along with foaming. The whole was reacted at the temperature for 5 hours. The system became a pale brown transparent liquid. The solution was cooled to 100° C. and then, 963 g (1.5 mol) of the intermediate 1 was charged thereinto, followed by 5 hours of the reaction with the remaining acid anhydride group at the temperature. Disappearance of the absorption of isocyanate group at 2270 cm$^{-1}$ and the absorption of acid anhydride group at 1860 cm$^{-1}$ was confirmed on IR, and a pale brown transparent polymerizable polyimide resin solution was obtained.

When the polyimide resin solution was applied onto a KBr plate and IR of the sample after evaporation of the solvent was measured, the following absorption was ascertained: absorption of imide ring at 725 cm$^{-1}$, 1780 cm$^{-1}$, and 1720 cm$^{-1}$; absorption of isocyanurate ring at 1690 cm$^{-1}$ and 1460 cm$^{-1}$; and furthermore, absorption of urethane bond at 1550 cm$^{-1}$. Moreover, Mn was found to be 4,800, Mw 7,700, the acid value 112, and the concentration of acryloyl group 0.67 mmol/g. Furthermore, the concentration of isocyanurate ring was found to be 0.78 mmol/g. Hereinafter, this polyimide resin solution is abbreviated as a resin solution P8.

A resist ink was prepared in a similar manner to Example 5 with the exception that the thus-obtained resin solution P8 was used instead of the resin solution P5, and then, evaluation tests of the above (5) to (9) were conducted. The evaluation results are shown in Table 3.

Example 9

Into a four-neck flask equipped with a stirring apparatus, a thermometer, and a condenser were charged 4300 g of diethylene glycol monoethyl ether acetate, 2079 g of IPDI-N (the molar amount of isocyanate group: 9 mol), 222 g (the molar amount of isocyanate group: 2 mol) of isophorone diisocyanate, and 148 g (1 mol) of dimethylolbutanoic acid, and the whole was heated to 80° C. under stirring while care was taken to heat generation. After 3 hours of reaction at the temperature, 1152 g (6 mol) of trimellitic anhydride was charged and the whole was heated to 150° C. under stirring. The reaction proceeded along with foaming. The whole was reacted at 150° C. for 4 hours and then cooled to 100° C. Thereafter, 15 g of methylhydroquinone was added and then 702 g (1.5 mol) of pentaerythritol triacrylate (hydroxyl value: 120) was added thereto, followed by 5 hours of reaction at 100° C. Disappearance of the absorption of isocyanate group at 2270 cm$^{-1}$ was confirmed on IR, and a pale yellow transparent polymerizable polyimide resin solution was obtained.

When the polyimide resin solution was applied onto a KBr plate and IR of the sample after evaporation of the solvent was measured, the following absorption was ascertained: absorption of imide ring at 725 cm$^{-1}$, 1780 cm$^{-1}$, and 1720 cm$^{-1}$; absorption of isocyanurate ring at 1690 cm$^{-1}$ and 1460 cm$^{-1}$; and furthermore, absorption of urethane bond at 1550 cm$^{-1}$. Moreover, Mn was found to be 4,700, Mw 14,000, the acid value 85, and the concentration of acryloyl group 1.14 mmol/g. Furthermore, the concentration of isocyanurate ring was found to be 0.76 mmol/g. Hereinafter, this polyimide resin solution is abbreviated as a resin solution P9.

A resist ink was prepared in a similar manner to Example 5 with the exception that the thus-obtained resin solution P9 was used instead of the resin solution P5, and then, evaluation tests of the above (5) to (9) were conducted. The evaluation results are shown in Table 3.

TABLE 3

| Item | Example | | | | |
|---|---|---|---|---|---|
| | 5 | 6 | 7 | 8 | 9 |
| Kind of resin solution | P5 | P6 | P7 | P8 | P9 |
| Finger touch dryness | A | A | A | A | A |
| UV curability | A | A | A | A | A |
| Developing property | | | | | |
| sodium carbonate | A | A | A | A | A |
| sodium hydroxide | A | A | A | A | A |
| DMA:Tg | | | | | |
| cured at 150° C. (° C.) | 240 | 190 | 200 | 210 | 210 |
| cured at 170° C. (° C.) | 250 | 210 | 210 | 230 | 215 |
| TMA:Tg | | | | | |
| cured at 150° C. (° C.) | 180 | 155 | 165 | 170 | 170 |
| cured at 170° C. (° C.) | 190 | 175 | 180 | 185 | 175 |
| αl | | | | | |
| cured at 150° C. (10$^{-6}$/° C.) | 71 | 74 | 73 | 72 | 80 |
| cured at 170° C. (10$^{-6}$/° C.) | 69 | 71 | 70 | 70 | 75 |
| PCT test | | | | | |
| Appearance | | | | | |
| cured at 150° C. | A | A | A | A | A |
| cured at 170° C. | B | B | B | B | B |
| Adhesion | | | | | |
| cured at 150° C. | B | B | B | B | B |
| cured at 170° C. | A | A | A | A | A |

The active energy ray-curable polyimide resin composition of the invention is excellent in curability, thermal resistance, and moisture resistance under a high temperature and a high pressure, capable of patterning with a dilute alkali aqueous solution, and also capable of using a common organic solvent, for example, a polar solvent having neither nitrogen atom nor sulfur atom as an organic solvent.

While the invention has been described in detail and with reference to specific examples thereof, it will be apparent to one skilled in the art that various changes and modifications can be made therein without departing from the spirit and scope thereof.

What is claimed is:

1. An active energy ray-curable polyimide resin composition which comprises a polymerizable polyimide resin (I) having an isocyanurate ring, an alicyclic structure, an imide ring and a (meth)acryloyl group and being capable of patterning with a dilute alkali aqueous solution.

2. The active energy ray-curable polyimide resin composition according to claim 1, wherein the polymerizable polyimide resin (I) has a concentration of isocyanurate ring of 0.4 to 1.2 mmol/g, a concentration of (meth)acryloyl group of 0.3 to 4 mmol/g, an acid value of 20 to 250, a number average molecular weight of 1,000 to 20,000, and a weight average molecular weight of 1,500 to 30,000.

3. The active energy ray-curable polyimide resin composition according to claim 1, which further contains an organic solvent (II), an epoxy compound (III) and a photoinitiator (IV).

4. The active energy ray-curable polyimide resin composition according to claim 1, which further contains an organic solvent (II), an epoxy compound (III), a photoinitiator (IV), and a reactive diluent (V).

5. The active energy ray-curable polyimide resin composition according to claim 1 or 3, wherein the polymerizable polyimide resin (I) is obtainable by a process comprising reacting a polyisocyanate compound (A) comprising an isocyanurate ring-containing polyisocyanate compound (A1) derived from an alicyclic diisocyanate compound and/or a urethane prepolymer (A2) having an isocyanate group at the terminal and being obtainable from the polyisocyanate compound (A1) and a polyol compound (a2), with an anhydride (B) of polycarboxylic acid having three or more carboxyl groups in an organic solvent, and successively with a compound (C1) having a (meth)acryloyl group and a hydroxyl group and/or a compound (C2) having a (meth)acryloyl group and an epoxy group.

6. The active energy ray-curable polyimide resin composition according to claim 5, wherein the polymerizable polyimide resin (I) is obtainable by reacting the polyisocyanate compound (A) with an acid anhydride having a carboxyl group as the polycarboxylic acid anhydride (B) and successively with the compound (C1) having a (meth)acryloyl group and a hydroxyl group and/or the compound (C2) having a (meth)acryloyl group and an epoxy group, or by reacting the polyisocyanate compound (A) with an acid anhydride having no carboxyl group as the polycarboxylic acid anhydride (B) and successively with the compound (C1) having a (meth)acryloyl group and a hydroxyl group.

7. The active energy ray-curable polyimide resin composition according to claim 5, wherein the polyisocyanate compound (A1) comprises a triisocyanate compound having one isocyanurate ring in an amount of 30% by weight or more.

8. The active energy ray-curable polyimide resin composition according to claim 5, wherein the polymerizable polyimide resin (I) is obtainable by adding, in the course of the reaction between the polyisocyanate compound (A) and the polycarboxylic acid anhydride (B), the compound (C1) having a (meth)acryloyl group and a hydroxyl group so that the ratio $(n_{c1})/(n_{ab})$ of the molar amount $(n_{c1})$ of the hydroxyl group in the compound (C1) to the total molar amount $(n_{ab})$ of the acid anhydride group and isocyanate group remaining in the reaction system is in the range of 0.9 to 2.0, and reacting them.

9. The active energy ray-curable polyimide resin composition according to claim 5, wherein the urethane prepolymer (A2) is obtainable by reacting the polyisocyanate compound (A1) and a polyol compound comprising a polyol (a21) having a carboxyl group, in such a molar ratio that the isocyanate group in the polyisocyanate compound (A1) is in excess of the hydroxyl group in the polyol compound.

10. The active energy ray-curable polyimide resin composition according to claim 5, wherein the polymerizable polyimide resin (I) is obtainable by using a tricarboxylic acid anhydride and/or a tetracarboxylic acid anhydride as the polycarboxylic acid anhydride (B) and using a compound having two to five (meth)acryloyl groups and one hydroxyl group as the compound (C1) having a (meth)acryloyl group and a hydroxyl group and/or the compound (C2) having a (meth)acryloyl group and an epoxy group.

11. The active energy ray-curable polyimide resin composition according to claim 6, wherein the organic solvent is a polar solvent containing neither nitrogen atom nor sulfur atom and capable of dissolving the polymerizable polyimide resin (I).

* * * * *